US012615905B2

(12) United States Patent
Wu et al.

(10) Patent No.: US 12,615,905 B2
(45) Date of Patent: Apr. 28, 2026

(54) ORGANIC ELECTROLUMINESCENT DEVICE, DISPLAY PANEL, AND DISPLAY APPARATUS

(71) Applicant: BOE Technology Group Co., Ltd., Beijing (CN)

(72) Inventors: Yong Wu, Beijing (CN); Siqi Wang, Beijing (CN); Rongrong Gao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 983 days.

(21) Appl. No.: 17/787,471

(22) PCT Filed: Aug. 4, 2021

(86) PCT No.: PCT/CN2021/110677
§ 371 (c)(1),
(2) Date: Jun. 20, 2022

(87) PCT Pub. No.: WO2022/062702
PCT Pub. Date: Mar. 31, 2022

(65) Prior Publication Data
US 2023/0043738 A1 Feb. 9, 2023

(30) Foreign Application Priority Data
Sep. 25, 2020 (CN) .......................... 202011019914.4

(51) Int. Cl.
*H10K 50/11* (2023.01)
*H10K 101/10* (2023.01)
*H10K 101/40* (2023.01)

(52) U.S. Cl.
CPC ......... *H10K 50/11* (2023.02); *H10K 2101/10* (2023.02); *H10K 2101/40* (2023.02)

(58) Field of Classification Search
CPC .. H10K 50/11; H10K 210/10; H10K 2101/40; H10K 50/12; H10K 59/10; H10K 2101/90; H10K 71/00
See application file for complete search history.

(56) References Cited

U.S. PATENT DOCUMENTS

| | | |
|---|---|---|
| 2014/0034927 A1 | 2/2014 | Seo et al. |
| 2017/0179417 A1 | 6/2017 | Seo et al. |

(Continued)

FOREIGN PATENT DOCUMENTS

| | | | |
|---|---|---|---|
| CN | 112151686 A | 12/2020 | |
| WO | WO-2020034805 A1 * | 2/2020 | ........... H10K 85/658 |

OTHER PUBLICATIONS

Vollbrecht, J. (2018). Excimers in organic electronics. New Journal of Chemistry, 42(14), 11249-11254. (Year: 2018).*

(Continued)

*Primary Examiner* — Dawn L Garrett
(74) *Attorney, Agent, or Firm* — IPro, PLLC

(57) ABSTRACT

The present invention provides an organic electroluminescent device, a display panel, and a display apparatus. A light-emitting layer comprises a first compound, a second compound, a third compound, and a fourth compound; the first compound and the second compound form a first exciplex under optical excitation and electric excitation; excitonic energy compounded by the first exciplex can be transferred to the third compound; then the third compound and the second compound are compounded to form a second exciplex; and excitonic energy compounded by the second exciplex can be transferred to the fourth compound. In the excitonic energy transfer process, triplet excitons improve a reverse intersystem crossing process and are converted into singlet excitons to radiate and emit fluorescence when an exciplex is formed by means of compounding; the singlet excitons are effectively used for Forster energy transfer, and (Continued)

| | |
|---|---|
| Cathode | 200 |
| Electron injection layer | 501 |
| Electron transport layer | 502 |
| Hole blocking layer | 503 |
| Light-emitting layer | 300 |
| Electron blocking layer | 403 |
| Hole transport layer | 402 |
| Hole injection layer | 401 |
| Anode | 100 |

(501, 502, 503 → 500)
(403, 402, 401 → 400)

Dexter energy transfer is inhibited, such that energy loss is avoided, the excitonic energy is effectively used, and the device efficiency is improved.

18 Claims, 4 Drawing Sheets

(56)                    References Cited

U.S. PATENT DOCUMENTS

2017/0338436 A1    11/2017  Mitsumori et al.
2018/0151630 A1     5/2018  Yamaoka et al.

OTHER PUBLICATIONS

Kalinowski, J. (2009). Excimers and exciplexes in organic electroluminescence. Materials Science (0137-1339), 27(3). (Year: 2009).*
Machine translation of WO-2020034805-A1 (publication date: Feb. 20, 2020) (Year: 2020).*

* cited by examiner 310                320                D

ORGANIC ELECTROLUMINESCENT DEVICE, DISPLAY PANEL, AND DISPLAY APPARATUS

CROSS REFERENCE TO RELATED APPLICATIONS

The application is a US National Stage of International Application No. PCT/CN2021/110677, filed on Aug. 4, 2021, which claims priority to Chinese Patent Application No. 202011019914.4, entitled "ORGANIC ELECTROLU-MINESCENT DEVICE, DISPLAY PANEL, AND DIS-PLAY APPARATUS", filed to China National Intellectual Property Administration on Sep. 25, 2020, the entire contents of which are incorporated herein by reference.

TECHNICAL FIELD

The disclosure relates to the technical field of display, in particular to an organic electroluminescent device, a display panel and a display apparatus.

BACKGROUND

In recent years, an organic light-emitting display (OLED), as a new type of flat panel display, has attracted more and more attention. Because of its active lighting, high brightness, high resolution, wide viewing angle, fast response, color saturation, lightness and thinness, low energy consumption, flexibility and the like, it is known as a dream display, and has become the mainstream display product in the market.

SUMMARY

In one aspect, an embodiment of the disclosure provides an organic electroluminescent device, including: an anode and a cathode in opposite, a light-emitting layer between the anode and the cathode, a first auxiliary function layer between the light-emitting layer and the anode, and a second auxiliary function layer between the light-emitting layer and the cathode. The light-emitting layer includes a first compound, a second compound, a third compound and a fourth compound. The first compound and the second compound can form a first excimer, and the second compound and the third compound can form a second excimer. An emission spectrum peak of the first excimer is smaller than an emission spectrum peak of the second excimer, an overlapping area between an emission spectrum of the first excimer and an absorption spectrum of the third compound is greater than a first set value, and an overlapping area between an emission spectrum of the second excimer and an absorption spectrum of the fourth compound is greater than a second set value.

In one possible implementation, in the organic electroluminescent device provided by the embodiment of the disclosure, the overlapping area between the emission spectrum of the first excimer and the absorption spectrum of the third compound is greater than or equal to 5%; and the overlapping area between the emission spectrum of the second excimer and the absorption spectrum of the fourth compound is greater than or equal to 5%.

In one possible implementation, in the organic electroluminescent device provided by the embodiment of the disclosure, a mass ratio of a mass of the first compound to a total mass of the first compound, the second compound and the third compound is greater than or equal to 30 wt %; a mass ratio of a mass of the second compound to the total mass of the first compound, the second compound and the third compound is greater than or equal to 40 wt %; a mass ratio of a mass of the third compound to the total mass of the first compound, the second compound and the third compound is smaller than or equal to 30 wt %; and a mass ratio of a mass of the fourth compound to the total mass of the first compound, the second compound and the third compound is smaller than or equal to 2 wt %.

In one possible implementation, in the organic electroluminescent device provided by the embodiment of the disclosure, a singlet energy level of the first excimer is greater than a singlet energy level of the second excimer, and a triplet energy level of the first excimer is greater than a triplet energy level of the second excimer; and the singlet energy level of the second excimer is greater than a singlet energy level of the fourth compound.

In one possible implementation, in the organic electroluminescent device provided by the embodiment of the disclosure, a difference between a HOMO value of the second compound and a HOMO value of the first compound is greater than 0.2 eV; and a difference between a LUMO value of the second compound and a LUMO value of the first compound is greater than 0.2 e V.

In one possible implementation, in the organic electroluminescent device provided by the embodiment of the disclosure, a difference between a HOMO value of the first compound and a HOMO value of the third compound is greater than 0.1 eV; and a difference between a LUMO value of the third compound and a LUMO value of the first compound is greater than 0.1 eV.

In one possible implementation, in the organic electroluminescent device provided by the embodiment of the disclosure, a difference between a HOMO value of the second compound and a HOMO value of the third compound is greater than 0.3 eV; and a difference between a LUMO value of the second compound and a LUMO value of the third compound is greater than 0.3 eV.

In one possible implementation, in the organic electroluminescent device provided by the embodiment of the disclosure, a difference between a LUMO value of the first compound and a LUMO value of a film layer in contact with the light-emitting layer in the first auxiliary function layer is greater than or equal to 0.3 eV; and a difference between the LUMO value of the first compound and a LUMO value of a film layer in contact with the light-emitting layer in the second auxiliary function layer is greater than or equal to 0.3 eV.

In one possible implementation, in the organic electroluminescent device provided by the embodiment of the disclosure, the first auxiliary function layer includes at least one of the following: a hole injection layer, a hole transport layer or an electron blocking layer; and the second auxiliary function layer includes at least one of the following: an electron injection layer, an electron transport layer or a hole blocking layer.

In one possible implementation, in the organic electroluminescent device provided by the embodiment of the disclosure, a hole mobility of the first compound is greater than an electron mobility thereof, and a hole mobility of the third compound is greater than an electron mobility thereof; and an electron mobility of the second compound is greater than a hole mobility thereof.

In one possible implementation, in the organic electroluminescent device provided by the embodiment of the disclosure, a molecular spacing between the third compound and the fourth compound is greater than 10 Å and smaller than 100 Å.

In one possible implementation, in the organic electroluminescent device provided by the embodiment of the disclosure, a molecular spacing between the second compound and the fourth compound is greater than 10 Å and smaller than 100 Å.

In one possible implementation, in the organic electroluminescent device provided by the embodiment of the disclosure, the third compound has a characteristic of emitting delayed fluorescence.

In another aspect, an embodiment of the disclosure further provides a display panel, including the plurality of above organic electroluminescent devices.

In another aspect, an embodiment of the disclosure further provides a display apparatus, including the above display panel.

DETAILED DESCRIPTION

Figure 1:
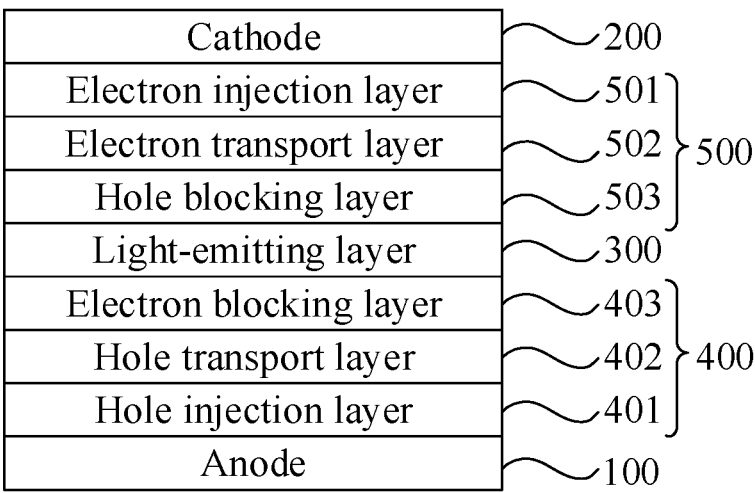
FIG. 1 is a schematic structural diagram of an organic electroluminescent device provided by an embodiment of the disclosure.

In order to make the objectives, technical solutions and advantages of the embodiments of the disclosure clearer, the technical solutions of the embodiments of the disclosure will be clearly and completely described below with reference to the accompanying drawings of the embodiments of the disclosure. It should be noted that the sizes and shapes of various patterns in the accompanying drawings do not reflect the true ratio, and are only intended to illustrate the content of the disclosure schematically. In addition, the same or similar numerals refer to the same or similar elements or elements having the same or similar functions throughout. Obviously, the described embodiments are some, but not all, embodiments of the disclosure. Based on the embodiments in the disclosure, all other embodiments acquired by those of ordinary skill in the art without creative work shall fall within the protection scope of the disclosure.

Unless otherwise defined, technical or scientific terms used herein should have the ordinary meaning as understood by one of ordinary skill in the art to which this disclosure belongs. The terms "first", "second" and the like used in the description and claims of the disclosure do not denote any order, quantity or importance, but are only used to distinguish different components. "Comprise" or "include" and similar words mean that the elements or objects appearing before the word encompass the elements or objects recited after the word and their equivalents, but do not exclude other elements or objects. "Inside", "outside", "up", "down" and the like are only used to indicate the relative positional relationship, and when the absolute position of the described object changes, the relative positional relationship may also change accordingly.

In recent years, with the emergence of phosphorescent OLEDs and thermally activated delayed fluorescence (TADF) OLEDs, organic light-emitting diodes (OLEDs) have solved the inherent low efficiency problem of fluorescent OLEDs, and the device performance has been rapidly improved. Electrons and holes are compounded to form excitons, of which 25% are singlet excitons and 75% are triplet excitons, the fluorescent OLEDs emit light through the singlet excitons, so their theoretical internal quantum efficiency $IQE \leq 25\%$, while the theoretical IQE of the phosphorescent OLEDs and the TADF-OLEDs is as high as 100%. Therefore, how to improve the external quantum efficiency (EQE) of the fluorescent OLEDs has always been the focus of research.

One method for improving the EQE of the fluorescent OLEDs is to obtain singlet excitons of fluorescent emitters through a Forster energy transfer process. Generally speaking, a host material obtains singlet excitons and triplet excitons in an excited state and triggers the radiation transition, and the singlet excitons are transferred through the Forster energy transfer process, so an auxiliary material is required to convert the triplet excitons of the host material into the singlet excitons. Phosphorescent materials and TADF materials are widely used materials for exciton conversion, the phosphorescent materials can convert the singlet excitons into the triplet excitons through an intersystem crossing (ISC) process to radiate and emit phosphorescence, and the TADF materials can convert the triplet excitons into the singlet excitons through a reverse intersystem crossing (RISC) process for fluorescent radiation. In a typical device structure using the singlet excitons, the most common method is to mix the host material, a TADF sensitizer and a fluorescent emitter material, where the fluorescent emitter material may also be replaced by a phosphorescent emitter material, and this method can effectively improve the OLED efficiency. In this system, excitonic energy transfer is carried out through the Forster energy transfer and Dexter energy transfer processes simultaneously. However, the Dexter energy transfer process will lead to a large amount of energy loss, thus reducing the device efficiency.

An organic electroluminescent device provided by an embodiment of the disclosure, as shown in FIG. 1, includes: an anode 100 and a cathode 200 oppositely arranged, a light-emitting layer 300 between the anode 100 and the cathode 200, a first auxiliary function layer 400 between the light-emitting layer 300 and the anode 100, and a second auxiliary function layer 500 between the light-emitting layer 300 and the cathode 200.

Figure 2:
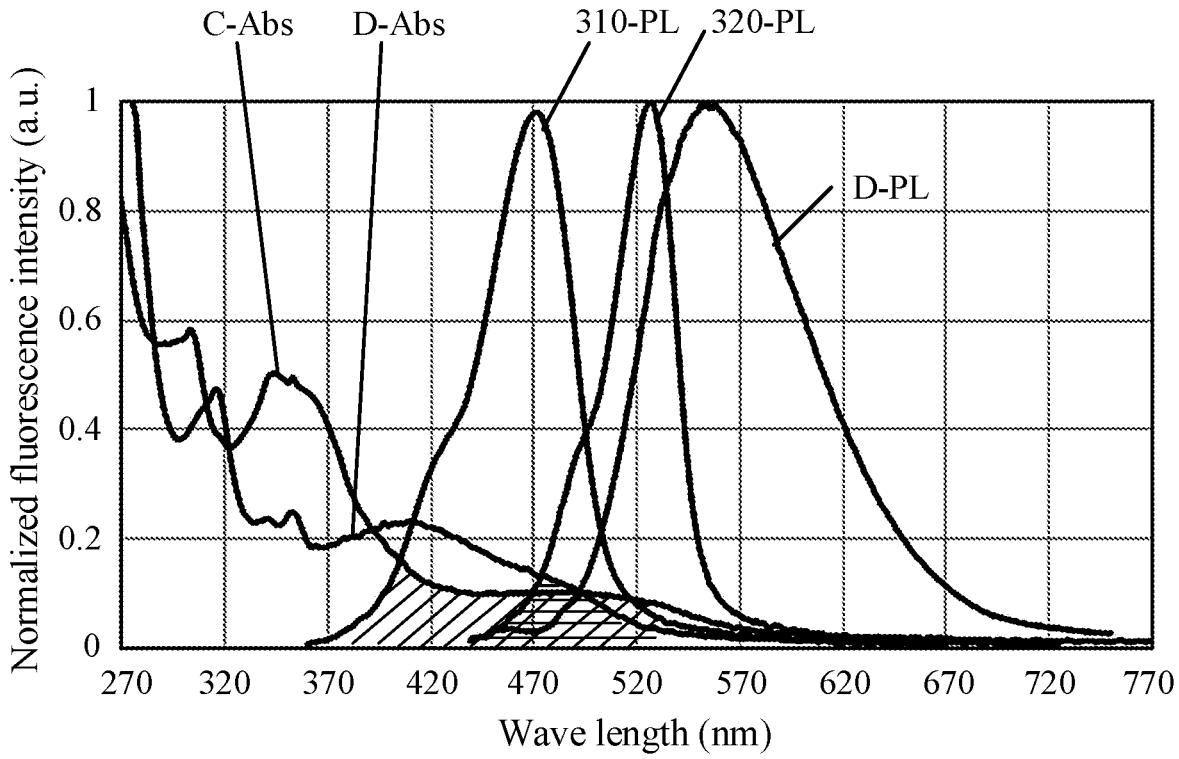
FIG. 2 is an absorption-emission spectrum diagram of an organic electroluminescent device provided by an embodiment of the disclosure.

The light-emitting layer 300 includes a first compound A, a second compound B, a third compound C and a fourth compound D. The first compound A and the second compound B can form a first excimer 310, and the second compound B and the third compound C can form a second excimer 320. As shown in FIG. 2, a Photoluminescence Spectroscopy (PL) peak of the first excimer 310 is smaller than a PL peak of the second excimer 320, an overlapping area (a region filled by slashes in FIG. 2) between a PL of the first excimer 310 and an absorption spectrum Abs of the third compound C is greater than a first set value, and an overlapping area (a region filled by slashes in FIG. 2) between a PL of the second excimer 320 and an absorption spectrum Abs of the fourth compound D is greater than a second set value.

In some embodiments, in the organic electroluminescent device provided by the embodiment of the disclosure, the light-emitting layer 300 includes the first compound A, the second compound B, the third compound C and the fourth compound D. The first compound A and the second compound B form the first excimer under optical excitation and electric excitation, the second compound B and the third compound C form the second excimer under optical excitation and electric excitation, the two excimeres enable triplet excitons to improve the reverse intersystem crossing (RISC) process and to be converted into singlet excitons to radiate and emit fluorescence, then the singlet excitons are effectively used for Forster energy transfer, and Dexter energy transfer is inhibited, such that energy loss is avoided, excitonic energy is effectively used, and the device efficiency is improved.

In some embodiments, as shown in FIG. 2, since the PL peak of the first excimer 310 is smaller than the PL peak of the second excimer 320, and there is an overlapping area between the PL of the first excimer 310 and the absorption spectrum Abs of the third compound C, the excitonic energy of the first excimer 310 may be transferred to the third compound C, and then the third compound C and the second compound B are compounded to form the second excimer 320. Since there is an overlapping area between the emission spectrum of the second excimer 320 and the absorption spectrum of the fourth compound D, the excitonic energy of the second excimer 320 may be transferred to the fourth compound D. In the excitonic energy transfer process, the triplet excitons are converted through the reverse intersystem crossing (RISC) process into the singlet excitons for fluorescent radiation during the formation of the excimer, the singlet excitons are effectively used for Forster energy transfer, and Dexter energy transfer is inhibited, such that energy loss is avoided, the excitonic energy is effectively used, and the device efficiency is improved.

Optionally, in the organic electroluminescent device provided by the embodiment of the disclosure, the overlapping area between the PL of the first excimer 310 and the absorption spectrum Abs of the third compound C is greater than or equal to 5%. In some embodiments, the larger the overlapping area (the higher the overlap) between the PL of the first excimer 310 and the absorption spectrum Abs of the third compound C, the more conductive the excitonic energy is to be transferred from the first excimer 310 to the third compound C, so as to achieve efficient energy transfer.

Optionally, in the organic electroluminescent device provided by the embodiment of the disclosure, the overlapping area between the PL of the second excimer 320 and the absorption spectrum Abs of the fourth compound D is greater than or equal to 5%. In some embodiments, the larger the overlapping area (the higher the overlap) between the PL of the second excimer 320 and the absorption spectrum Abs of the fourth compound D, the more conductive the excitonic energy is to be transmitted from the second excimer 320 to the fourth compound D, so as to achieve efficient energy transfer.

Optionally, in the organic electroluminescent device provided by the embodiment of the disclosure, the first compound A, the second compound B and the third compound C may be considered as host materials, and the total amount may be considered as 100%. Adjusting the different proportion of the three compounds in the total amount will lead to different device efficiencies. The fourth compound D may be considered as a guest material, and different device efficiencies may be obtained by adjusting a doping ratio of the fourth compound D in the total mass of the host materials.

In some embodiments, a mass ratio of a mass of the first compound A to a total mass of the first compound A, the second compound B and the third compound C is generally greater than or equal to 30 wt %; a mass ratio of a mass of the second compound B to the total mass of the first compound A, the second compound B and the third compound C is generally greater than or equal to 40 wt %; a mass ratio of a mass of the third compound C to the total mass of the first compound A, the second compound B and the third compound C is generally smaller than or equal to 30 wt %; and a mass ratio of a mass of the fourth compound D to the total mass of the first compound A, the second compound B and the third compound C is generally smaller than or equal to 2 wt %.

In some embodiments, in the host materials, since the second compound B may form the first excimer 310 with the first compound A, and may form the second excimer 320 with the third compound C, the proportion of the second compound B is generally the largest. Moreover, the first excimer 310 may excite the third compound C, and therefore, the proportion of the third compound C is generally the smallest. The specific relationship between the proportion of the three compounds and device parameters is detailed in the subsequent experimental parameters.

Figure 3:
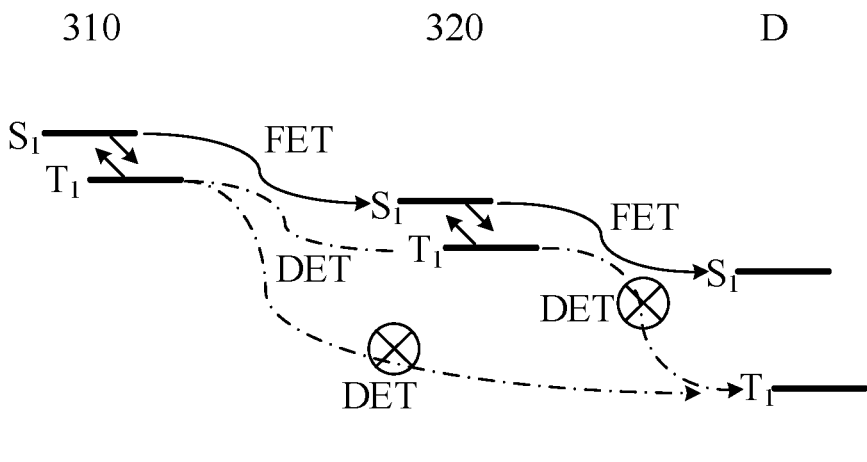
FIG. 3 is an energy transfer diagram of an organic electroluminescent device provided by an embodiment of the disclosure.

Optionally, in the organic electroluminescent device provided by the embodiment of the disclosure, as shown in FIG. 3, a singlet energy level S1 of the first excimer 310 is generally greater than a singlet energy level S1 of the second excimer 320, meanwhile, a triplet energy level T1 of the first excimer 310 is generally greater than a triplet energy level T1 of the second excimer 320, which is beneficial to achieve that the singlet excitons S1 of the first excimer 310 effectively transfer energy to the singlet energy level S1 of the second excimer 320 through Forster energy transfer (FET) (it may be considered that the first excimer 310 excites the third compound C to generate the second excimer 320), and Dexter energy transfer (DET) with large energy loss between the triplet energy levels T1 is inhibited. Meanwhile, a singlet energy level S1 of the second excimer 320 is generally greater than a singlet energy level S1 of the fourth compound D, which is beneficial to achieve that the singlet excitons S1 of the second excimer 320 effectively transfer energy to the singlet energy level S1 of the fourth compound D through Forster energy transfer (FET), Dexter energy transfer (DET) with large energy loss between the triplet energy levels T1 is inhibited, excitonic energy transfer can be effectively improved, and thus the efficiency of the organic electroluminescent device is enhanced.

Optionally, in the organic electroluminescent device provided by the embodiment of the disclosure, the third compound C may have a characteristic of delayed fluorescence, which enables the triplet excitons to be converted into the singlet excitons through the reverse intersystem crossing (RISC) process for fluorescence radiation, which is beneficial to inhibit the Dexter energy transfer (DET) with large energy loss between the triplet energy levels Tl, and achieve that the singlet excitons S1 of the second excimer 320 effectively transfer the energy to the singlet energy level S1 of the fourth compound D through the Forster energy transfer (FET).

Figure 4:
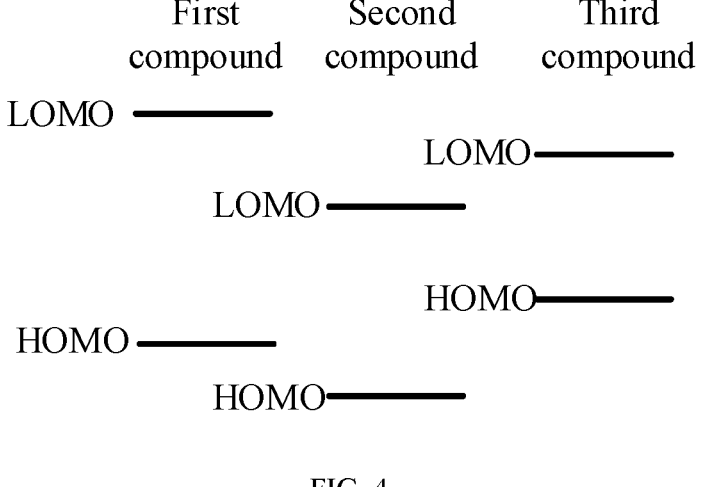
FIG. 4 is an energy level diagram of an organic electroluminescent device provided by an embodiment of the disclosure.

Optionally, in the organic electroluminescent device provided by the embodiment of the disclosure, as shown in FIG. 4, a difference between a Highest Occupied Molecular Orbital (HOMO) value of the second compound B and a HOMO value of the first compound A is generally greater than 0.2 eV, and a difference between a Lowest Unoccupied Molecular Orbital (LUMO) value of the second compound B and a LUMO value of the first compound A is generally greater than 0.2 eV. Specifically, $[HOMO_B|-|HOMO_A|>0.2$ eV, $|LUMO_B|-|LUMO_A|>0.2$ eV.

It is worth noting that the HOMO value refers to an absolute value of a HOMO energy level, and the LUMO value refers to an absolute value of a LUMO energy level.

Optionally, in the organic electroluminescent device provided by the embodiment of the disclosure, as shown in FIG. 4, a difference between a HOMO value of the first compound A and a HOMO value of the third compound C is generally greater than 0.1 eV, and a difference between a LUMO value of the first compound A and a LUMO value of the third compound C is generally greater than 0.1 eV. Specifically, $|HOMO_A|-|HOMO_C|>0.1$ eV, $|LUMO_C|-|LUMO_A|>0.1$ eV.

Optionally, in the organic electroluminescent device provided by the embodiment of the disclosure, as shown in FIG. 4, a difference between a HOMO value of the second compound B and a HOMO value of the third compound C is greater than 0.3 eV, and a difference between a LUMO value of the second compound B and a LUMO value of the third compound C is generally greater than 0.3 eV. Specifically, $|HOMO_B|-|HOMO_C|>0.3$ eV, $|LUMO_B|-|LUMO_C|>0.3$ eV.

In some embodiments, the above energy level relationship facilitates the formation of the first excimer 310 from first compound A and the second compound B, and the formation of the second excimer 320 from the second compound B and the third compound C.

Optionally, in the organic electroluminescent device provided by the embodiment of the disclosure, as shown in FIG. 1, the first auxiliary function layer 400 may include at least one of the following: a hole injection layer 401, a hole transport layer 402 or an electron blocking layer 403; and the second auxiliary function layer 500 may include at least one of the following: an electron injection layer 501, an electron transport layer 502 or a hole blocking layer 503.

In some embodiments, FIG. 1 takes the first auxiliary function layer 400 including the hole injection layer 401, the hole transport layer 402 and the electron blocking layer 403, and the second auxiliary function layer 500 including the electron injection layer 501, the electron transport layer 502 and the hole blocking layer 503 as an example for illustration, and a specific position relationship between film layers is shown in FIG. 1. In practical application, the auxiliary function layer may be selected as required. For example, the electron blocking layer 403 is only selected for the first auxiliary function layer 400, and the hole blocking layer 503 is only selected for the second auxiliary function layer 500, which is not described in detail here.

In some embodiments, when the organic electroluminescent device provided by the embodiment of the disclosure is actually manufactured, the anode 100, the hole injection layer 401, the hole transport layer 402, the electron blocking layer 403, the light-emitting layer 300, the hole blocking layer 503, the electron transport layer 502, the electron injection layer 501 and the cathode 200 may be sequentially formed on base substrate.

In some embodiments, the base substrate may be selected from any transparent base material, such as glass and polyimide.

The anode 100 is selected from a high-work function electrode material.

The hole injection layer 401 may be formed by P-type doping in a hole transport material through co-evaporation. A thickness of the hole injection layer 401 is selected as 5 nm-20 nm.

The hole transport layer 402 has a good hole transport characteristic, and a thickness of the hole transport layer 402 is selected as 10 nm-2000 nm.

A hole mobility of the electron blocking layer 403 is 1-2 orders of magnitude higher than an electron mobility thereof, and transportation of electrons can be effectively blocked. The thickness of the electron blocking layer 403 is selected as 5 nm-100 nm.

An electron mobility of the hole blocking layer 503 is 1-2 orders of magnitude higher than a hole mobility thereof, the HOMO energy level is deep, transportation of holes is effectively blocked, so that the exciton recombination occurs in the light-emitting layer.

The electron transport layer 502 has a good electron transport characteristic, and a thickness of the electron transport layer 502 is selected as 20 nm-100 nm.

The electron injection layer 501 may be selected from LiF, Yb, LiQ and other materials, and a thickness of the electron injection layer 501 is selected as 1 nm-10 nm.

The cathode 200 may be selected from one or more materials of Al, Ag and Mg.

Optionally, in the organic electroluminescent device provided by the embodiment of the disclosure, a difference between the LUMO value of the first compound A and a LUMO value of a film layer in contact with the light-emitting layer 300 in the first auxiliary function layer 400 is generally greater than or equal to 0.3 eV. For example, in the structure shown in FIG. 1, a difference between the LUMO value of the first compound A and a LUMO value of the electron blocking layer EBL is generally greater than or equal to 0.3 eV, and specifically, $|LUMO_A|-|LUMO_{EBL}|\geq0.3$ eV. A difference between the LUMO value of the first compound A and a LUMO value of a film layer in contact with the light-emitting layer 300 in the second auxiliary function layer 500 is generally greater than or equal to 0.3 eV. For example, in the structure shown in FIG. 1, a difference between the LUMO value of the first compound A and a LUMO value of the hole blocking layer HBL is generally greater than or equal to 0.3 eV, and specifically, $|LUMO_A|-|LUMO_{HBL}|\geq0.3$ eV.

In some embodiments, the energy level relationship facilitates the injection of the holes and electrons into the light-emitting layer 300 to limit the exciton recombination region within the light-emitting layer 300.

Optionally, in the organic electroluminescent device provided by the embodiment of the disclosure, the hole mobility of the first compound A is generally greater than the electron mobility, and the hole mobility of the third compound C is greater than the electron mobility, that is, hole transport type host materials are selected for the first compound A and the third compound C; and meanwhile, the electron mobility of the second compound B needs to be greater than the hole mobility, that is, an electron transport type host material is selected for the second compound B. Therefore, it facilitates the formation of the first excimer 310 by the first compound A and the second compound B, and the formation of the second excimer 320 by the second compound B and the third compound C, and vice versa. That is, the electron transport type host materials are selected for the first compound A and the third compound C, and the hole transport type host material is selected for the second compound B. In some embodiments, generally for the hole transport type host material, the hole mobility$>1*10^{-6}$ cm$^2$/V*S$>$the electron mobility, and for the electron transport type host material, the electron mobility$>1*10^{-6}$ cm$^2$/V*S$>$the hole mobility.

Figure 5:
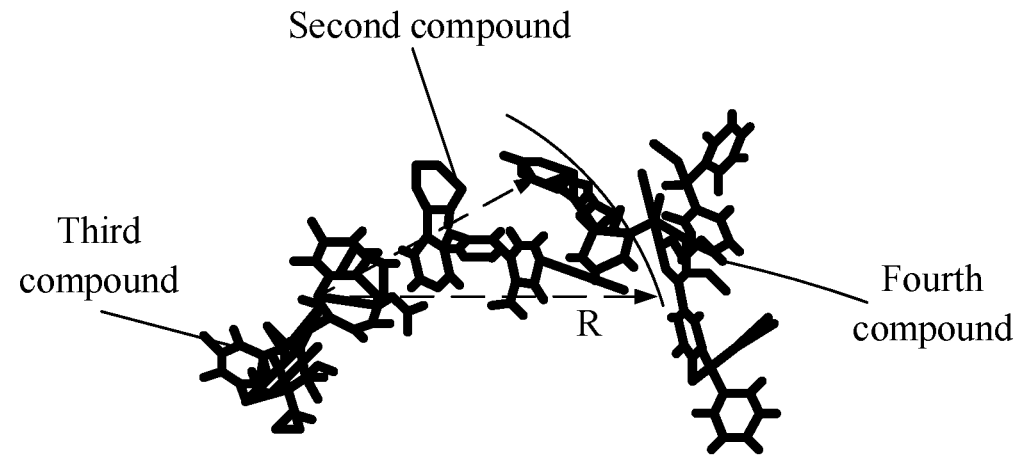
FIG. 5 is a molecular relation diagram of an organic electroluminescent device provided by an embodiment of the disclosure.

Optionally, in the organic electroluminescent device provided by the embodiment of the disclosure, in order to inhibit Dexter energy transfer in the light-emitting layer 300 and improve Forster energy transfer, it is necessary to have a large spacing between molecules in which the energy transfer occurs. Therefore, as shown in FIG. 5, a molecular spacing between the third compound C and the fourth compound D needs to be greater than 10 Å and smaller than 100 Å, and the molecular spacing may be generally controlled at 14.1 Å-19 Å. A molecular spacing between the second compound B and the fourth compound D is greater than 10 Å and smaller than 100 Å.

In some embodiments, two comparative examples and six embodiments are provided according to the structure of the organic electroluminescent device provided the disclosure. The film layer structures in the comparative examples and the six embodiments are the same. In some embodiments, the anode, the hole injection layer HIL of 10 nm, the hole transport layer HTL of 100 nm, the electron blocking layer EBL of 5 nm, the light-emitting layer, the hole blocking layer HBL of 5 nm, the electron transport layer ETL of 20 nm, the electron injection layer EIL of 5 nm, and the cathode of AL are sequentially manufactured on the anode. The host materials in comparative example 1 are the first compound A and the second compound B, that is, in comparative example 1, only the first excimer is formed. The host materials in comparative example 2 are the second compound B and the third compound C, that is, in comparative example 2, only the second excimer is formed. The doping proportions of the fourth compound D in embodiments 1-5 are the same, and only the proportion parameters of the three compounds in the host materials are adjusted. The detail parameters are shown in Table 1:

TABLE 1

|  | A/(A + B + C) | B/(A + B + C) | C/(A + B + C) | D/(A + B + C) |
|---|---|---|---|---|
| Embodiment 1 | 40 wt % | 40 wt % | 20 wt % | 0.5 wt % |
| Comparative example 1 | 50 wt % | 50 wt % | 0 | 0.5 wt % |
| Comparative example 2 | 0 | 50 wt % | 50 wt % | 0.5 wt % |
| Embodiment 2 | 45 wt % | 40 wt % | 15 wt % | 0.5 wt % |
| Embodiment 3 | 45 wt % | 45 wt % | 10 wt % | 0.5 wt % |
| Embodiment 4 | 30 wt % | 45 wt % | 25 wt % | 0.5 wt % |
| Embodiment 5 | 40 wt % | 45 wt % | 15 wt % | 0.5 wt % |
| Embodiment 6 | 40 wt % | 45 wt % | 15 wt % | 1 wt % |

The device performances of the comparative examples and the embodiments are compared from the following data: current efficiency CE, power efficiency PE, external quantum efficiency EQE and luminescence chromaticity CIE, and the specific measurement data are shown in Table 2:

TABLE 2

| | Power Efficiency (lm/W) | | Current Efficiency (cd/A) | | EQE (%) | | CIE | |
|---|---|---|---|---|---|---|---|---|
| | 1000 cd/m² | Max | 1000 cd/m² | Max | 1000 cd/m² | Max | x | y |
| Embodiment 1 | 38.9 | 45.4 | 60.4 | 62.5 | 17 | 17.5 | 0.43 | 0.56 |
| Comparative example 1 | 21.6 | 25.7 | 34.1 | 36.8 | 10.2 | 11.6 | 0.44 | 0.56 |
| Comparative example 2 | 17.3 | 20.4 | 26.4 | 29.7 | 7.5 | 8.9 | 0.42 | 0.54 |
| Embodiment 2 | 34.7 | 41.4 | 56.8 | 57.3 | 16.8 | 16.9 | 0.44 | 0.56 |
| Embodiment 3 | 37.5 | 44.1 | 58.9 | 60.4 | 16.7 | 17.1 | 0.43 | 0.56 |
| Embodiment 4 | 31.8 | 38.5 | 52.8 | 56.4 | 16.1 | 16.7 | 0.44 | 0.55 |
| Embodiment 5 | 32.1 | 39 | 53.4 | 58.5 | 16.8 | 17.4 | 0.44 | 0.55 |
| Embodiment 6 | 36.4 | 43.8 | 57.4 | 59.7 | 16.5 | 16.9 | 0.43 | 0.56 |

Figure 6:
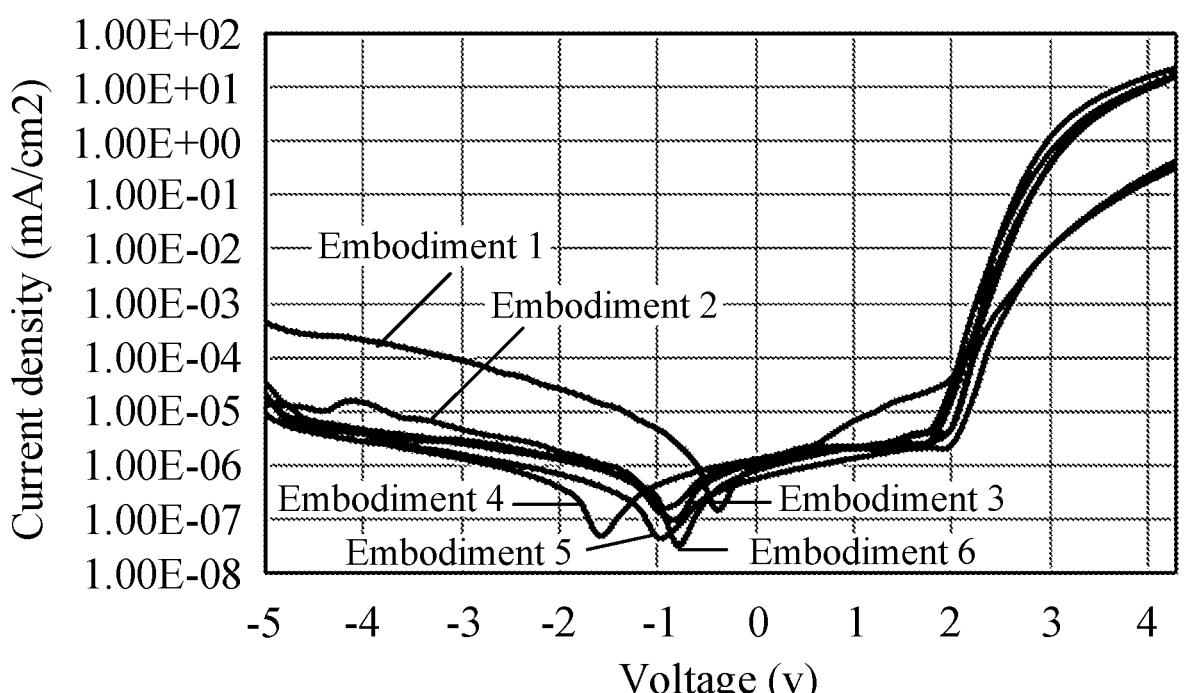
FIG. 6 shows a current density-voltage characteristic in experimental data provided by respective embodiments of the disclosure.

It can be seen from Table 2 and FIG. 6 that, the device efficiency by using three compounds as the host materials in the light-emitting layer to form two excimeres in embodiments 1-6 provided by the disclosure can be improved compared with that in the comparative examples 1-2. From the comparison of embodiments 1-5, it can be seen that the proportion of the third compound C in the host materials should not be too small or too large, so as to avoid reducing the molecular spacing after the increase of the proportions of other compounds, which is not conductive to Forster energy transfer. Meanwhile, the proportion difference of the first compound A and the second compound B also should not be too large, so as to not reduce the molecular spacing by the compound with a large proportion, which is not conductive to Forster energy transfer. Moreover, from the comparison between embodiment 5 and embodiment 6, it can be seen that increasing the doping proportion of the fourth compound D within a certain range will improve the device efficiency.

Figure 7:
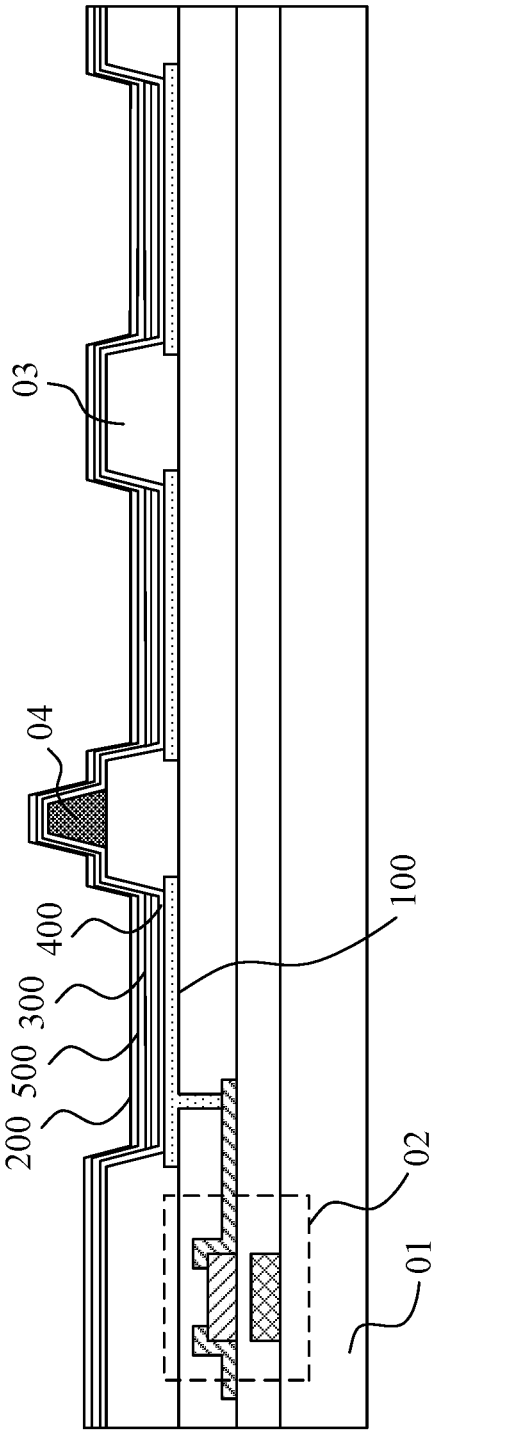
FIG. 7 is a schematic structural diagram of a display panel provided by an embodiment of the disclosure.

Based on the same inventive concept, an embodiment of the disclosure further provides a display panel, as shown in FIG. 7, including the plurality of above organic electroluminescent devices provided by the embodiment of the disclosure. In some embodiments, the display panel includes: a base substrate 01, a thin film transistor 02 on the base substrate 01, an anode 100 connected to a drain of the thin film transistor 02, a pixel defining layer 03 for defining a light-emitting region of each pixel, a spacer 04, and a first auxiliary function layer 400 including a hole injection layer and a hole transport layer, a light-emitting layer 300, a second auxiliary function layer 500 including an electron transport layer, and a cathode 200 which are sequentially formed on the pixel defining layer 03. The first auxiliary function layer 400, the second auxiliary function layer 500, the cathode 200 and other film layers are film layers disposed on the whole surface of the base substrate 01, materials of the light-emitting layer 300 in different pixel light-emitting regions are different, and thicknesses may also be different. FIG. 7 only illustrates one implementable structure of pixel light-emitting regions of R, G and B and a thin film transistor of one pixel, and the structure of the display panel is not limited to this. Since the principle of solving the above problem of the display panel is similar to the above organic electroluminescent device, the implementation of the display panel may refer to the implementation of the organic electroluminescent device, and the repetition will not be made.

Based on the same inventive concept, an embodiment of the disclosure further provides a display apparatus, including the above display panel provided by the embodiment of the disclosure. The display apparatus may be any products or components with display functions such as a mobile phone, a tablet computer, a television, a monitor, a notebook computer, a digital photo frame and a navigator. Other essential components of the display apparatus should be understood by those skilled in the art, and will not be repeated herein, nor should it be used as a limitation of the disclosure. The implementation of the display apparatus may refer to the implementation of the above organic electroluminescent device, and the repetition will not be made.

The disclosure provides the organic electroluminescent device, the display panel and the display apparatus. The light-emitting layer includes the first compound, the second compound, the third compound and the fourth compound; the first compound and the second compound form the first excimer under optical excitation and electronic excitation, and the second compound and the third compound form the second excimer under optical excitation and electronic excitation; excitonic energy of the first excimer can be transferred to the third compound, and then the third compound and the second compound are compounded to form the second excimer; and excitonic energy of the second excimer can be transferred to the fourth compound. In the excitonic energy transfer process, the triplet excitons are converted into the singlet excitons through the reverse intersystem crossing process for fluorescence radiation when the excimer is formed by means of compounding; and the singlet excitons are effectively used for Forster energy transfer, and Dexter energy transfer is inhibited, such that energy loss is avoided, the excitonic energy is effectively used, and the device efficiency is improved.

Obviously, those skilled in the art can make various modifications and variations to the embodiments of the disclosure without departing from the spirit and scope of the embodiments of the disclosure. As such, provided that these modifications and variations of the embodiments of the disclosure fall within the scope of the claims of the disclosure and their equivalents, the disclosure is also intended to cover such modifications and variations.

What is claimed is:

1. An organic electroluminescent device, comprising:
an anode and a cathode in opposite;
a light-emitting layer between the anode and the cathode;
a first auxiliary function layer between the light-emitting layer and the anode; and
a second auxiliary function layer between the light-emitting layer and the cathode;
wherein
the light-emitting layer comprises a first compound, a second compound, a third compound and a fourth compound, the first compound and the second compound allowing formation of a first excimer, and the second compound and the third compound allowing formation of a second excimer;
an emission spectrum peak of the first excimer is smaller than an emission spectrum peak of the second excimer;
an overlapping area between an emission spectrum of the first excimer and an absorption spectrum of the third compound is greater than a first set value, and an overlapping area between an emission spectrum of the second excimer and an absorption spectrum of the fourth compound is greater than a second set value.

2. The organic electroluminescent device according to claim 1, wherein a mass ratio of a mass of the first compound to a total mass of the first compound, the second compound and the third compound is greater than or equal to 30 wt %;
a mass ratio of a mass of the second compound to the total mass of the first compound, the second compound and the third compound is greater than or equal to 40 wt %;
a mass ratio of a mass of the third compound to the total mass of the first compound, the second compound and the third compound is smaller than or equal to 30 wt %; and
a mass ratio of a mass of the fourth compound to the total mass of the first compound, the second compound and the third compound is smaller than or equal to 2 wt %.

3. The organic electroluminescent device according to claim 1, wherein a singlet energy level of the first excimer is greater than a singlet energy level of the second excimer, and a triplet energy level of the first excimer is greater than a triplet energy level of the second excimer; and
the singlet energy level of the second excimer is greater than a singlet energy level of the fourth compound.

4. The organic electroluminescent device according to claim 1, wherein a difference between a Highest Occupied Molecular Orbital (HOMO) value of the second compound and a HOMO value of the first compound is greater than 0.2 eV; and
a difference between a Lowest Unoccupied Molecular Orbital (LUMO) value of the second compound and a LUMO value of the first compound is greater than 0.2 eV.

5. The organic electroluminescent device according to claim 1, wherein a difference between a Highest Occupied Molecular Orbital (HOMO) value of the first compound and a HOMO value of the third compound is greater than 0.1 eV; and
a difference between a Lowest Unoccupied Molecular Orbital (LUMO) value of the third compound and a LUMO value of the first compound is greater than 0.1 eV.

6. The organic electroluminescent device according to claim 1, wherein a difference between a Highest Occupied Molecular Orbital (HOMO) value of the second compound and a HOMO value of the third compound is greater than 0.3 eV; and
a difference between a Lowest Unoccupied Molecular Orbital (LUMO) value of the second compound and a LUMO value of the third compound is greater than 0.3 eV.

7. The organic electroluminescent device according to claim 6, wherein
a difference between a LUMO value of the first compound and a LUMO value of a film layer in contact with the light-emitting layer in the first auxiliary function layer is greater than or equal to 0.3 eV; and
a difference between the LUMO value of the first compound and a LUMO value of a film layer in contact with the light-emitting layer in the second auxiliary function layer is greater than or equal to 0.3 eV.

8. The organic electroluminescent device according to claim 7, wherein
the first auxiliary function layer comprises at least one of following: a hole injection layer, a hole transport layer or an electron blocking layer; and the second auxiliary function layer comprises at least one of following: an electron injection layer, an electron transport layer or a hole blocking layer.

9. The organic electroluminescent device according to claim 1, wherein a hole mobility of the first compound is greater than an electron mobility of the first compound;

a hole mobility of the third compound is greater than an electron mobility of the third compound; and an electron mobility of the second compound is greater than a hole mobility of the second compound.

10. The organic electroluminescent device according to claim 1, wherein a molecular spacing between the third compound and the fourth compound is greater than 10 Å and smaller than 100 Å.

11. The organic electroluminescent device according to claim 1, wherein a molecular spacing between the second compound and the fourth compound is greater than 10 Å and smaller than 100 Å.

12. The organic electroluminescent device according to claim 1, wherein the third compound has a characteristic of delayed fluorescence.

13. A display panel, comprising: a plurality of organic electroluminescent devices, wherein the organic electroluminescent device comprises:

an anode and a cathode in opposite;

a light-emitting layer between the anode and the cathode;

a first auxiliary function layer between the light-emitting layer and the anode; and a second auxiliary function layer between the light-emitting layer and the cathode;

wherein the light-emitting layer comprises a first compound, a second compound, a third compound and a fourth compound;

the first compound and the second compound are capable of forming a first excimer, and the second compound and the third compound are capable of forming a second excimer;

an emission spectrum peak of the first excimer is smaller than an emission spectrum peak of the second excimer;

an overlapping area between an emission spectrum of the first excimer and an absorption spectrum of the third compound is greater than a first set value, and an overlapping area between an emission spectrum of the second excimer and an absorption spectrum of the fourth compound is greater than a second set value.

14. A display apparatus, comprising: a display panel, wherein the display panel comprises a plurality of organic electroluminescent devices, wherein the organic electroluminescent device comprises:

an anode and a cathode in opposite;

a light-emitting layer between the anode and the cathode;

a first auxiliary function layer between the light-emitting layer and the anode; and a second auxiliary function layer between the light-emitting layer and the cathode;

wherein the light-emitting layer comprises a first compound, a second compound, a third compound and a fourth compound;

the first compound and the second compound are capable of forming a first excimer, and the second compound and the third compound are capable of forming a second excimer;

an emission spectrum peak of the first excimer is smaller than an emission spectrum peak of the second excimer;

an overlapping area between an emission spectrum of the first excimer and an absorption spectrum of the third compound is greater than a first set value, and an overlapping area between an emission spectrum of the second excimer and an absorption spectrum of the fourth compound is greater than a second set value.

15. The display panel according to claim 13, wherein a mass ratio of a mass of the first compound to a total mass of the first compound, the second compound and the third compound is greater than or equal to 30 wt %;

a mass ratio of a mass of the second compound to the total mass of the first compound, the second compound and the third compound is greater than or equal to 40 wt %;

a mass ratio of a mass of the third compound to the total mass of the first compound, the second compound and the third compound is smaller than or equal to 30 wt %; and a mass ratio of a mass of the fourth compound to the total mass of the first compound, the second compound and the third compound is smaller than or equal to 2 wt %.

16. The display panel according to claim 13, wherein a singlet energy level of the first excimer is greater than a singlet energy level of the second excimer, and a triplet energy level of the first excimer is greater than a triplet energy level of the second excimer; and the singlet energy level of the second excimer is greater than a singlet energy level of the fourth compound.

17. The display panel according to claim 13, wherein a hole mobility of the first compound is greater than an electron mobility of the first compound;

a hole mobility of the third compound is greater than an electron mobility of the third compound; and an electron mobility of the second compound is greater than a hole mobility of the second compound.

18. The display panel according to claim 13, wherein the third compound has a characteristic of delayed fluorescence.

* * * * *